(12) United States Patent
Lou

(10) Patent No.: US 6,791,400 B2
(45) Date of Patent: Sep. 14, 2004

(54) FREQUENCY-TUNING LOOP USED IN THE TRANSCONDUCTOR-CAPACITOR FILTER

(75) Inventor: Chih-Hong Lou, I-Lan (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 10/323,752

(22) Filed: Dec. 20, 2002

(65) Prior Publication Data
US 2003/0234683 A1 Dec. 25, 2003

(30) Foreign Application Priority Data
Jun. 19, 2002 (TW) .................................... 091113352 A

(51) Int. Cl.[7] .................................................. H03B 1/00
(52) U.S. Cl. ..................................... 327/554; 327/555
(58) Field of Search ................................ 327/551, 552, 327/553, 554, 555, 556, 557, 558, 559

(56) References Cited

U.S. PATENT DOCUMENTS

| | | | | |
|---|---|---|---|---|
| 5,194,831 A | * | 3/1993 | Jackson ...................... | 331/111 |
| 5,489,873 A | * | 2/1996 | Kamata et al. ............. | 327/558 |
| 5,508,570 A | * | 4/1996 | Laber et al. ................ | 327/563 |
| 5,625,317 A | * | 4/1997 | Deveirman ................. | 327/553 |
| 6,111,467 A | * | 8/2000 | Luo ............................ | 330/305 |
| 6,400,932 B1 | * | 6/2002 | Oh et al. .................. | 455/150.1 |
| 6,584,157 B1 | * | 6/2003 | Van Der Zwan et al. ... | 375/247 |
| 2002/0153942 A1 | * | 10/2002 | Burkhard .................... | 327/556 |

* cited by examiner

Primary Examiner—Terry D. Cunningham
(74) Attorney, Agent, or Firm—Rosenberg, Klein & Lee

(57) ABSTRACT

A frequency-tuning loop of the invention used in the Transconductor-Capacitor filter is composed of: a first switching device and a second switching device, both having two signal-inputting ends and two signal-outputting ends for switching the output of two signals alternately from two signal-outputting ends according to a fixed clock signal. A transconductor's inputting ends linking to the two signal-outputting ends of said first switching device. One end of a first switch linking to the positive outputting end of the transconductor and the other end linking to the first capacitor and a signal-inputting end of the second switching device. One end of a second switch linking to the negative outputting end of the transconductor and the other end linking to the second capacitor and another signal-inputting end of the second switching device; and a integrated circuit composed of an integrator, a third capacitor, and a fourth capacitor. The positive and negative inputting ends linking respectively to the two signal-outputting ends of the second switching device.

7 Claims, 5 Drawing Sheets

FREQUENCY-TUNING LOOP USED IN THE TRANSCONDUCTOR-CAPACITOR FILTER

BACKGROUND OF THE INVENTION

1. Field of the Invention

The invention relates to the frequency tuning circuit, more particularly to a frequency-tuning loop in the Transconductor-Capacitor filter.

2. Description of the Prior Art

A filter is a common but important unit in a general signal processing system, the function of which is to eliminate the unnecessary band and to preserve or amplify the necessary ones. In the production process of advanced integrated circuits, it is a general and common trend to integrate filters into the design of the chip.

The cut-off frequency and the reciprocal of the time constant of the filter are in direct ratio. The time constant in the active RC filter is symbolized by the R.C value and that in the transconductor-capacitor filter is symbolized by the C/Gm value. However, due to the uncertainty of the integrated-circuit-fabrication process, the resistance value, the capacitance value, and even the value of resistance value multiplying capacitance value produced, the most important in the filter, range greatly, and therefore the frequency precision of the filters produced is below standard or unstable.

Therefore, a frequency-tuning loop is needed to set the filter, which can focus on a signal-inputting resource (such as a constant clock signal), to measure the time constant, and to alter or adjust the cut-off frequency of the filter.

A Transconductor-Capacitor filter is a common filtering technique that has a high-speed feature. The most important thing in designing a Transconductor-Capacitor filter is to make sure that the cut-off frequency is controlled in a designed range that does not change with the production process, temperature, or time. There are two common controlling methods, one is to make the calibration to the cut-off frequency of the filter according to the inputting clock, which can repair all the differences in the production process. Having the advantage, that once it is calibrated it will not affect the filter anymore. The disadvantage being, that precision in the calibration is limited—incapable of doing repairs to the variables such as temperature changing, time aging, etc. At the same time; the other method uses a continuous tuning to the cut-off frequency of the filter according to the consistency of the inputting clock signal, having the advantage that it can do repairs to the variables such as temperature changing, time aging, etc. But also the disadvantage is that the offset current produced by the Transconductor will affect the adjusted results and therefore lower the degree of precision needed.

As shown in FIG. 1A, a block diagram of a prior Transconductor-Capacitor filter with a frequency-tuning loop, after the inputting signal goes through the Transconductor-Capacitor filter 110, there is a filtered outputting signal, and this Transconductor-Capacitor filter 110 has a frequency-tuning Loop 112 that receives a fixed clock and generates tuning-voltage for the Transconductor-Capacitor filter 110 to adjust the outputting signal according to the calibration of this clock.

FIG. 1B is a model diagram of the interior circuit of the frequency-tuning loop 112 in FIG. 1A, a tuning circuit designed according to "a novel approach for the automatic tuning of continuous-time filters" in IEEE proc. ISCAS-91, the idea of which is to use the charge-transforming negative-feedback loop. The transconductor 120 itself to form the resistance $$R = \frac{1}{Gm}$$

of equal effect with the negative-feedback while the voltage produced by the current supply $I_r$ from the positive end of the Transconductor 120 going through Gm is $$V = \frac{I_r}{Gm}.$$

The on and off of the first switch 122 and the second switch 123 are respectively controlled by the clock and their on-off conditions are different. When the check controlling first switch 122 is high-level then conductive, the capacitance $C_{1p}$ is filled with charge $Q_p$, and $$Q_p = C_{1p} * V = \frac{C_{1p} * I_r}{Gm},$$

and at this time the second switch 123 is off and in open-circuit condition, which makes the capacitance $C_{1p}$ and the later circuit unable to affect each other. And when the high-level of the clock turns to low-level, the first switch 122 is switched off and becomes an open-circuit, and the second switch 123 conductive, and at this time the charge $Q_p$ deposited in the capacitance $C_{1p}$ is transformed to outputting voltage $$\Delta V_{cp}, \Delta V_{cp} = \frac{-Q_p}{C_{2p}} = \frac{-C_{1p}}{C_{2p}} * \frac{I_r}{Gm},$$

on the integrator circuit constituted by integrator 124, the capacitance $C_{2p}$, and the capacitance $C_{2n}$.

Moreover, since there is another current supply 125 on the inputting end of the integrator 124, the current value of which is $N*I_r$, therefore the outputting of the integrator increases constantly, and in a unit of clock period T=1/f, the increased voltage of the integrator 124 due to the current resource 125 is $$\Delta V_1 = \frac{I}{C_{2p}} * T = \frac{N * I_r}{C_{2p}} * \frac{1}{f}.$$

And when the negative-feedback loop reaches balance in the end, $\Delta V_{cp} + \Delta V_1 = 0$, the Equation 1 can also be reached:

$$\frac{-C_{1p}}{C_{2p}} * \frac{I_r}{Gm} + \frac{N * I_r}{C_{2p}} * \frac{1}{f} = 0 \quad \text{(Equation 1)}$$

$$\therefore \Rightarrow \frac{Gm}{C_{1p}} = \frac{f}{N}$$

Therefore, we can see that the tuning-frequency of the frequency-tuning loop 112 can be controlled with its f/n value, thus the cut-off frequency of the Transconductor-Capacitor filter can be tuned to the designed value with this frequency-tuning loop 112.

Besides, the units connected to the other inputting end of the transconductor 120, such as the third switch 126, the fourth switch 127, and the capacitance $C_{1n}$, $C_{2n}$, have similar way of connecting among each unit itself, the principle of action, and other units as the way described above, and only that it is connected to the other end so the outputting voltage $\Delta V_{cn}$ is different from $\Delta V_{cp}$ by a negative sign. Then $\Delta V_{cn}$ and $\Delta V_{cp}$ outputted after going through a differential to single converter 128 and a low-pass filter 129 is the needed tuning-voltage.

However, the circuit mentioned above is in an ideal situation, and in a real situation, unavoidably, there will be an offset current. FIG. 1C is a practical equal-effect model of FIG. 1B to illustrate the real situation, in which offset current 130 indicates the offset current produced by the transconductor 120 in the real situation, therefore a real transconductor can be equaled to an ideal transconductor 120 plus an offset current 130, and the current produced by this offset current 130 is marked $I_{offset}$. Thereupon the current going through this differential to single converting transconductor 120 here becomes $I_r+I_{offset}$. And making use of the said analyzing method, Equation 2 can be reached:

$$\frac{-C_{1p}}{C_{2p}} * \frac{(I_r + I_{offset})}{Gm} + \frac{N * I_r}{C_{2p}} * \frac{1}{f} = 0 \quad \text{(Equation 2)}$$

$$\therefore \Rightarrow \frac{Gm}{C_{1p}} = \frac{f\left(1 + \frac{I_{offset}}{I_r}\right)}{N}$$

It can be seen that the offset current produced by the Transconductor 120 will affect the value of the tuning frequency, and the error amount and the value are in direct ratio. And since the offset current changes because of the producing process of the Transconductor itself, the temperature of the environment, and the time factor, a frequency-tuning loop that is not affected by the offset current produced by the Transconductor is needed to upgrade the precision of the frequency-tuning loop.

SUMMARY OF THE INVENTION

Due to the several disadvantages in controlling the cut-off frequency of the traditional Transconductor-Capacitor filter in the background of invention described above, the invention provides a frequency-tuning loop used in the Transconductor-Capacitor filter in order to overcome the traditional problems.

The main purpose of the invention is to provide a frequency-tuning loop that is not affected by the offset current produced by the referential Transconductor in order to upgrade the precision of frequency of the Transconductor-Capacitor filter.

According to the purpose described above, the invention provides a frequency-tuning loop used in the Transconductor-Capacitor filter, comprising a transconductor; the positive inputting end of this transconductor connects to the switch 1a and 1b, with the other end of the switch 1a connecting to a positive current supply and the other end of the switch 1b connecting to a negative current supply; the negative inputting end of the transconductor links connects to the switch 1a' and 1b', with the other end of the switch 1a' connecting to a negative current supply and the other end of the switch 1b' connecting to a positive current supply. The action of switch 1a accords with switch 1a', the action of switch 1b accords with switch 1b', and the action of switch 1a and 1a' and switch 1b and 1b' occur alternately.

The outputting end links connects to the switch 2a and 2b respectively, with the other end of the switch 2a connecting to the first capacitance, switch 3a, switch 3b', and the other end of the switch 2b connecting to the second capacitance, switch 3a', switch 3b. The on-and-off action of the switch 3a and 3a' is followed with that of switch 1a, the on-and-off action of the switch 3b and 3b' accords with that of switch 1b.

In the following is the integrated circuit consisting of the integrator, the third capacitance, and the fourth capacitance. The third capacitance is to store the charges transmitted from the first capacitance, and the fourth capacitance is to store the charges transmitted from the second capacitance. The positive inputting end of the integrator connects to the other end of the switch 3a' and the switch 3b, and the negative inputting end of the integrator links connects to the other end of the switch 3a and the switch 3b. A differential to single converter is connected to the outputting end of the integrator in order to transform the differential signal output by the integrator to single end signal and then a low-pass filter is connected to the outputting end of this differential to single converter.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A preferred embodiment of the invention will be described in detail in the following. However, in addition to the detailed description, the invention can be widely put into practice in other embodiments and the scope of the invention is not confined to this preferred embodiment but takes the claim in the following as standard.

A frequency-tuning loop of the invention used in the Transconductor-Capacitor filter is composed of: a first switching device and a second switching device, the two switching device each having two signal-inputting ends and two signal-outputting ends to repetitively switch and output from the two outputting ends the signals input by the two inputting ends according to a constant clock signal; a transconductor with its positive and negative inputting ends each connecting to the two signal-outputting ends of the first switching device; a first switch, one end connecting to the positive outputting end of the transconductor and the other end connecting to the first capacitance and a signal-inputting end of the second switching device; a second switch, one end connecting to the negative outputting end of the transconductor and the other end connecting to the second capacitance and another signal-inputting end of the second switching device; and a integrated circuit composed of a integrator, a third capacitance, and a fourth capacitance, the positive and negative inputting ends connecting respectively to the two signal-outputting ends of the second switching device. Then the outputting of this integrator connects a differential to a single converter and a low-pass filter in order to transform the differential signal output by the integrator to the single end signal and filter.

Figure 1A:
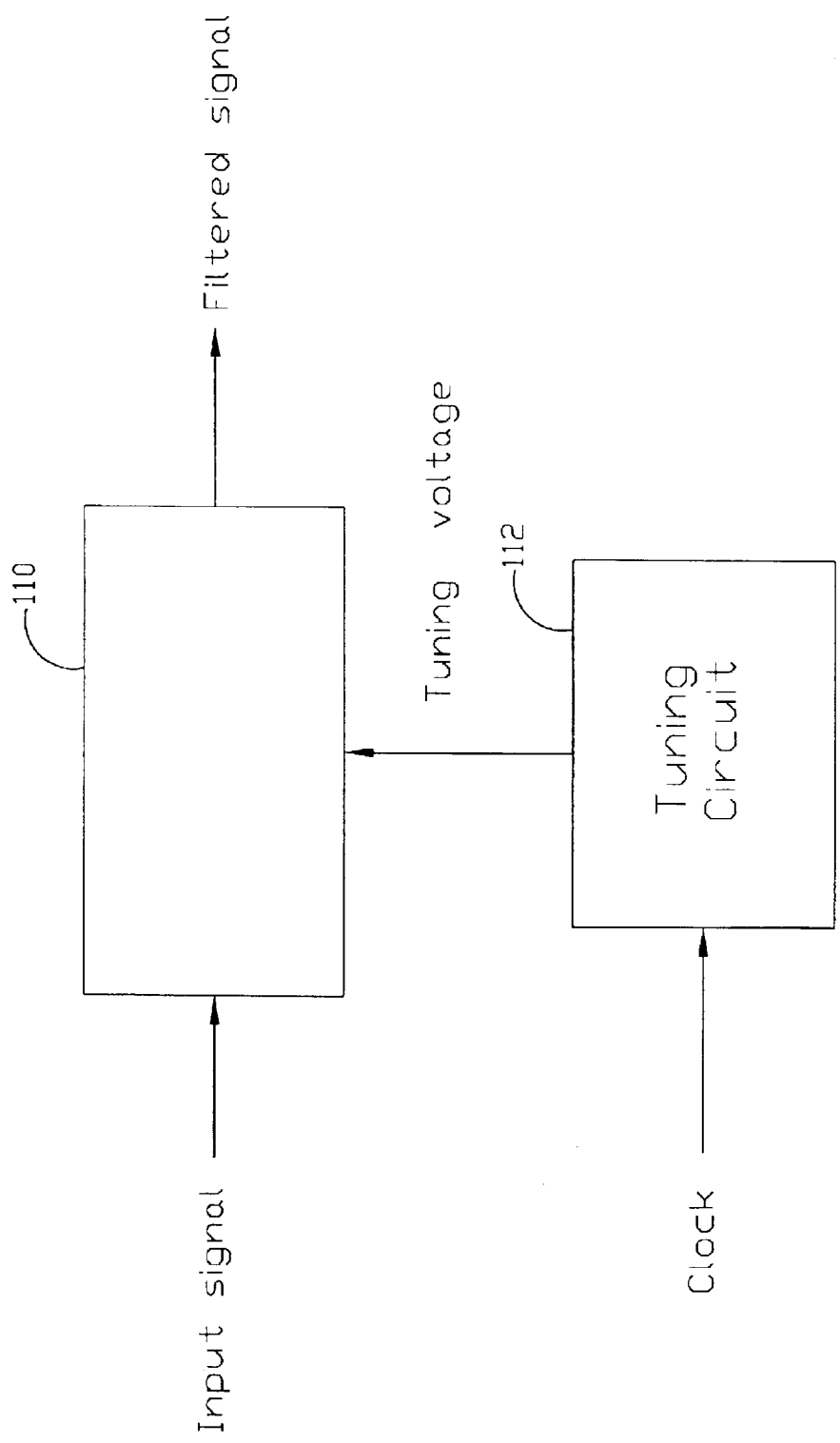
FIG. 1A shows a block diagram of a prior Transconductor-Capacitor filter with frequency-tuning loop.
Figure 1B:
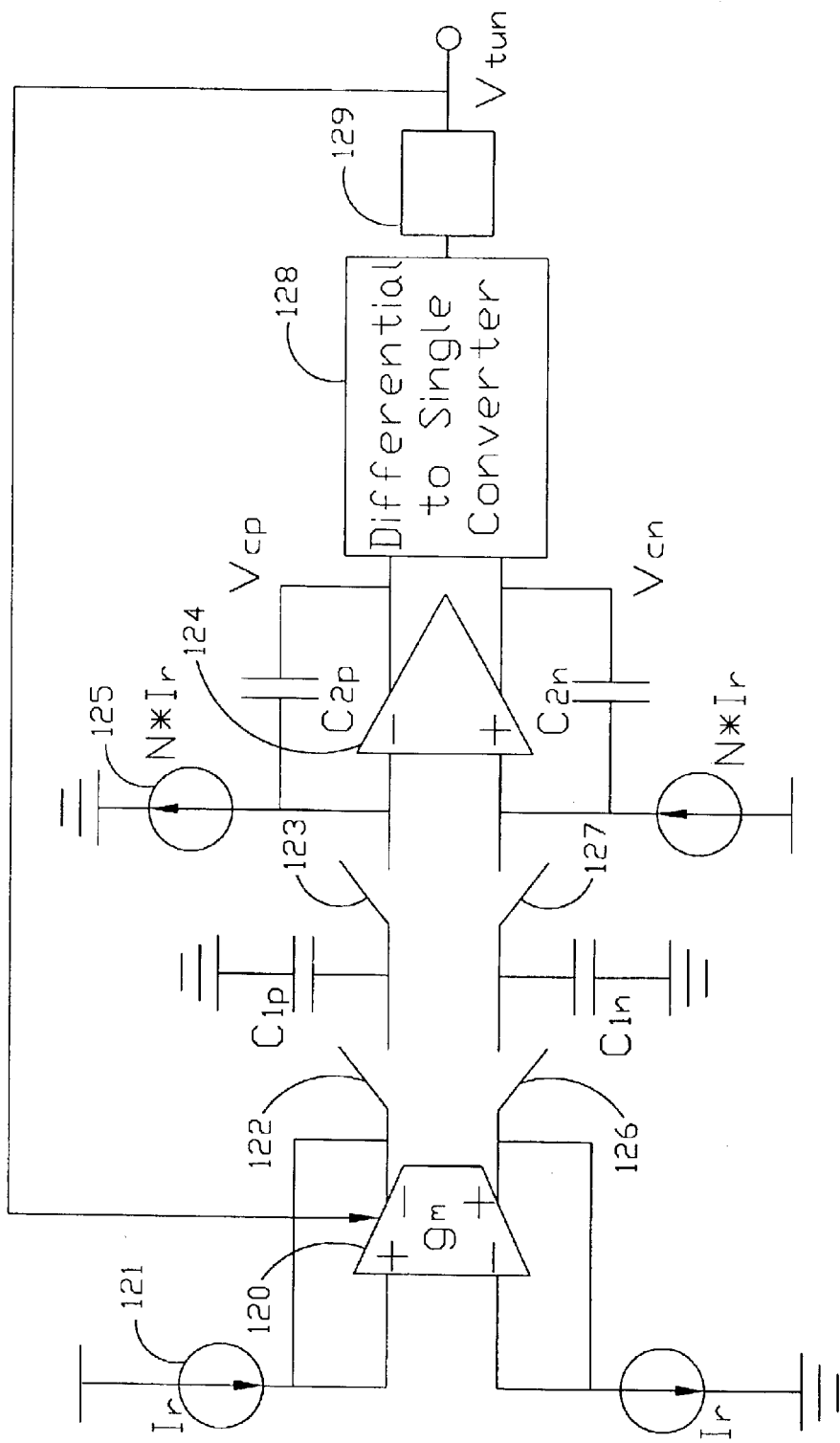
FIG. 1B shows a prior ideal frequency-tuning loop.
Figure 1C:
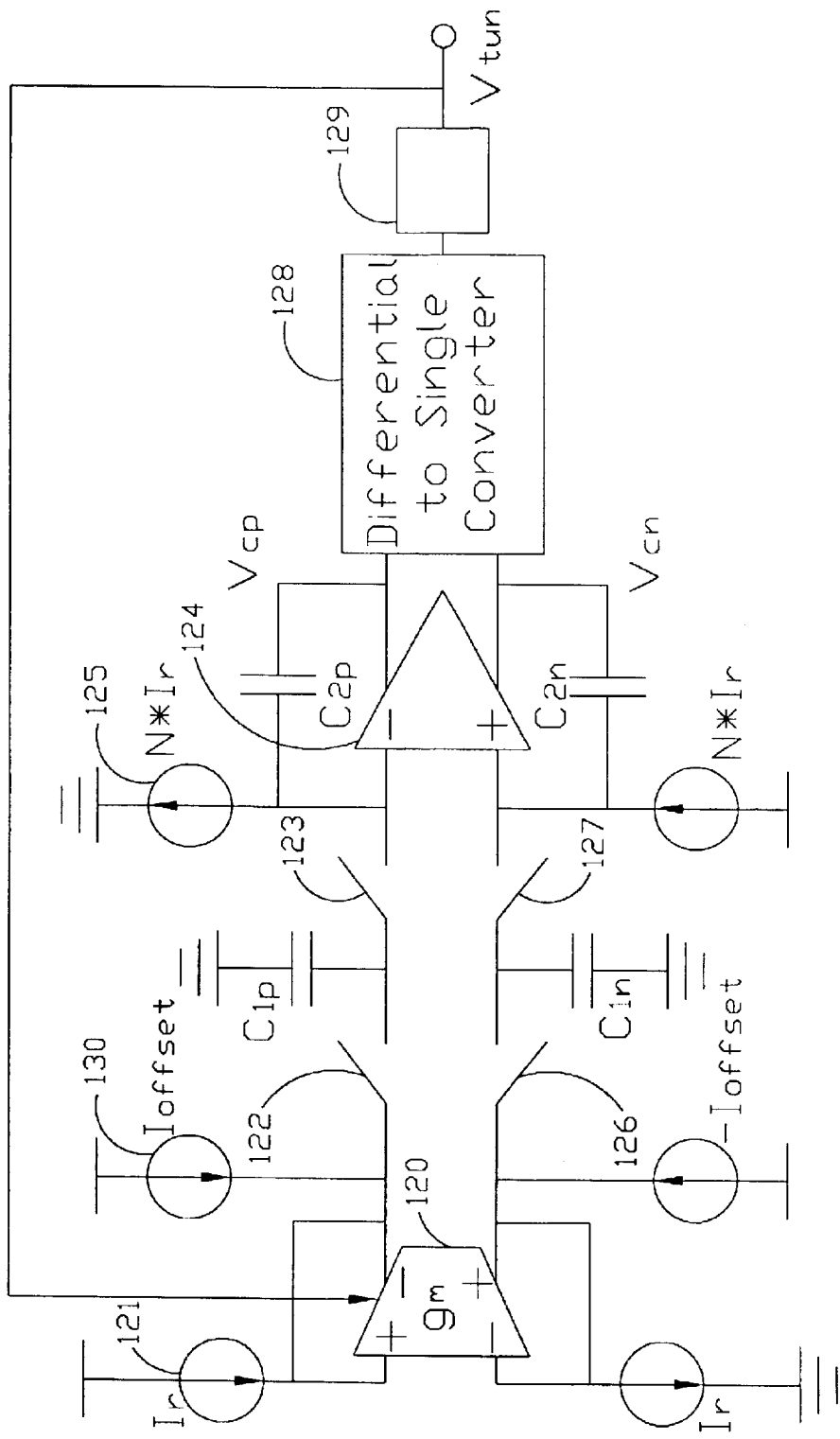
FIG. 1C shows a prior practical equal-effect frequency-tuning loop.
Figure 2A:
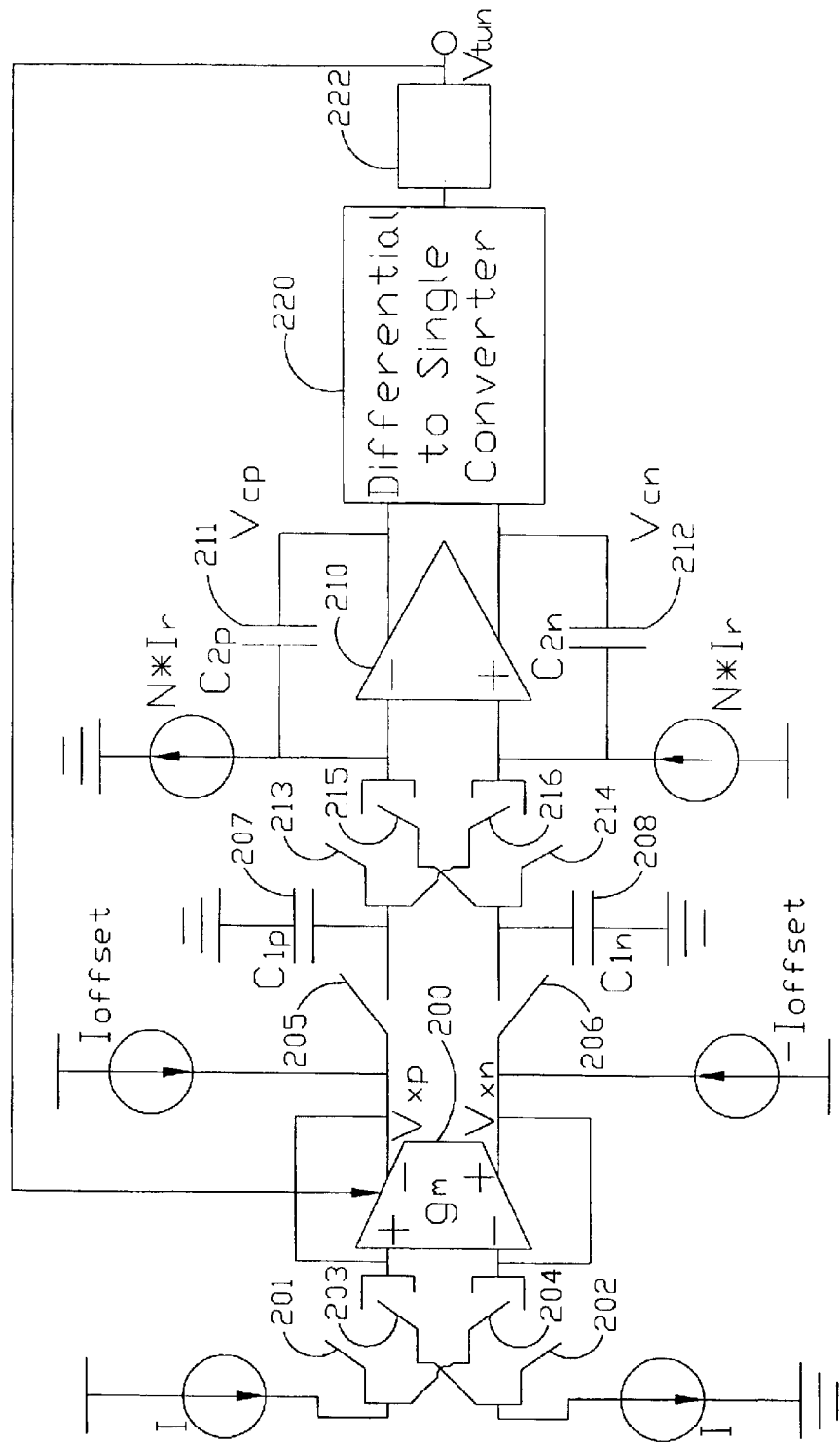
FIG. 2A shows a preferred embodiment of the frequency-tuning loop of the invention.

FIG. 2A is a preferred embodiment of the frequency-tuning loop of the invention, in which a transconductor 200 has a positive and a negative inputting and outputting ends. The positive and negative inputting ends connecting to a referential current supply $I_r$ of the same intensity but different directions of current. The switch 1a 201, switch 1a' 202, switch 1b 203, and switch 1b' 204 of which the on-and-off action is controlled by the clock to connect the current supply and the inputting end of the transconductor 200. The switch 1a 201 and the switch 1a' 202 have the same on-and-off action controlled by clock $\Phi_{1a}$, and the switch 1b 203 and the switch 1b' 204 have the same on-and-off action controlled by clock $\Phi_{1b}$. In addition, the on-and-off action of the switch 1a 201 and 1a' 202 is opposite to that of the switch 1b 203 and 1b' 204.

The outputting ends of the transconductor 200 connect to the first capacitance 207 and the second capacitance 208 through the switch 2a 205 and 2b 206, the other ends of the first capacitance 207 and the second capacitance 208 grounded, and the first capacitance 207 and the second capacitance 208 being the same capacitance units, or capacitance units of the same capacitance value or feature.

A comparative integrated circuit is composed of the integrator 210, the third capacitor 211, the fourth capacitor 212, and a referential current supply $N*I_R$ of same intensity and the different direction of current, N indicating a variable, $N*I_r$ indicating N times of $I_r$ value, and the third capacitor 211 and the fourth capacitor 212 being the same capacitance units, or capacitance units of the same capacitance value or feature.

In addition to connecting to the first capacitance 207, the switch 2a 205 also like connects to one end of the switch 3a 213 and 3b' 216, the other end of the switch 3a 213 connecting to the negative inputting end of the integrator 210 and the other end of switch 3b' 216 connecting to the positive inputting end of the integrator 210. In addition to connecting to the second capacitance 208, the switch 2b 206 also connects to one end of the switch 3a' 214 and switch 3b 215, the other end of switch 3a' 214 also connecting to the positive inputting end of the integrator 210 and the other end of switch 3b 215 connecting to the negative inputting end of the integrator 210. The switch 3a 213, 3a' 214, 3b 215, and 3b' 216 are all switching units controlled by the clock, wherein the switch 3a 213 and switch 3a' 214 are controlled by $\Phi_{3a}$, the switch 3b 215 and switch 3b' 216 are controlled by $\Phi_{3b}$. The on-and-off action of switch 3a 213 is following with that of 3a' 214, and the on-and-off action of switch 3b 215 is following with that of 3b' 216 but different from that of switch 3a 213 and 3a' 214.

However, in a real situation, unavoidably, there will be an offset current in the transconductor 200, so a supply current $I_{offset}$ is used to indicate the offset current produced by the transconductor 200, and thus a supply current $I_{offset}$ of same intensity and different electrode status is connected respectively to the positive and negative outputting of the transconductor 200 to equally stimulate the offset current produced by the transconductor 200 in real situation.

Considering when clock $\Phi_{1a}$ during high level, the switch 1a 201 and 1a' 202 are on, as the principle and analysis of action described above, the positive inputting $$\Delta V_{xp} \text{ of the transconductor is} + \frac{(I_r + I_{offset})}{Gm},$$

and the negative outputting $$\Delta V_{xn} \text{ is} - \frac{(I_r + I_{offset})}{Gm}.$$

And when clock $\Phi_{1b}$ during high level, the switch 1a 201 and 1a' 202 are off and the switch 1b 203 and 1b' 204 switch on, the current supply $I_r$ and the transconductor 200 are linked alternately, and therefore the positive outputting level $$\Delta V_{xp} \text{ becomes} + \frac{(-I_r + I_{offset})}{Gm}$$

and the negative outputting $$\Delta V_{xn} \text{ becomes} - \frac{(-I_r + I_{offset})}{Gm}.$$

When the on-and-off action switches, the direction of $I_r$ changes and the sign of the outputting voltage changes, but the current of the offset current $I_{offset}$ cannot change its direction through the switching of the switch, and therefore it performs like an offset item.

Then, when clock $\Phi_2$ during high level, the switch 2a 205 and 2b 206 are on, the outputting voltage of the transconductor is stored respectively in the first capacitor 207 and the second capacitor 208, and since the first capacitor 207 and the second capacitor 208 are the same capacitance units and thus have the same capacitance value, and therefore the third capacitor 211 and the fourth capacitor 212 are the same capacitance units and have the same capacitance value. Since the action of the switch 3a 213 and 3a' 214 and that of the switch 1a 201 and 1a' 202 are similar, when the switch 3a 213 and 3a' 214 are on, as the previous analysis, the outputting $\Delta V_{cp}$ and $\Delta V_{cn}$ of the integrator 210 are $$\Delta V_{cp} = -\frac{C_1}{C_2} * \Delta V_{xp} \text{ and } \Delta V_{cn} = -\frac{C_1}{C_2} * \Delta V_{xn}.$$

And since the switch 3a 213 and 3a' 214 are also on when the switch 1a 201 and 1a' 202 are on, thus $$\Delta V_{cp} = -\frac{C_1}{C_2} * \Delta V_{xp} = -\frac{C_1}{C_2} * \left( + \frac{(I_r + I_{offset})}{Gm} \right) \text{ and}$$

$$\Delta V_{cn} = -\frac{C_1}{C_2} * \Delta V_{xn} = -\frac{C_1}{C_2} * \left( - \frac{(I_r + I_{offset})}{Gm} \right).$$

And when clock $\Phi_{1b}$ during high level, the switch 1b 203 and 1b' 204 are on, after that, the clock $\Phi_{3b}$, will be turned to a higher level, the switch 3b 216 and 3b' 215 are also on, at this time the way of connecting between the first capacitance 207 and the second capacitance 208 and the integrator 210 become staggered, thus the first capacitance 207 connects to the positive inputting end of the integrator 210 through the conductive switch 3b' 216, and the second capacitance 208 connects to the negative inputting end of the integrator 210 through the conductive switch 3b 215. Since the inputting signals are switched, the outputting of the integrator becomes $$\Delta V_{cp} = -\frac{C_1}{C_2} * \Delta V_{xn} \text{ and } \Delta V_{cn} = -\frac{C_1}{C_2} * \Delta V_{xp},$$

in other words, $$\Delta V_{cp} = -\frac{C_1}{C_2} * \Delta V_{xn} = -\frac{C_1}{C_2} * \left(-\frac{(-I_r + I_{offset})}{Gm}\right) \text{ and}$$

$$\Delta V_{cn} = -\frac{C_1}{C_2} * \Delta V_{xp} = -\frac{C_1}{C_2} * \left(+\frac{(-I_r + I_{offset})}{Gm}\right).$$

When the inputting end of the integrator 210 goes through the signal-switching process for one time, plus the input before and after the switch and makes the output after the inputting signal switched once, which means:

$$\Delta V_{cp}(\text{after one switch}) = \Delta V_{cp}(\text{before switch}) + \Delta V_{cp}(\text{after switch})$$

$$= -\frac{C_1}{C_2} * \left(+\frac{(I_r + I_{offset})}{Gm}\right) - \frac{C_1}{C_2} * \left(-\frac{(-I_r + I_{offset})}{Gm}\right)$$

$$= -\frac{C_1}{C_2} * \frac{((I_r + I_{offset}) - (-I_r + I_{offset}))}{Gm}$$

$$= -\frac{C_1}{C_2} * \left(\frac{2I_r}{Gm}\right)$$

and $$\Delta V_{cn}(\text{after one switch}) = \Delta V_{cn}(\text{before switch}) + \Delta V_{cn}(\text{after switch})$$

$$= -\frac{C_1}{C_2} * \left(-\frac{(I_r + I_{offset})}{Gm}\right) - \frac{C_1}{C_2} * \left(+\frac{(-I_r + I_{offset})}{Gm}\right)$$

$$= -\frac{C_1}{C_2} * \frac{(-(I_r + I_{offset}) + (-I_r + I_{offset}))}{Gm}$$

$$= -\frac{C_1}{C_2} * \left(\frac{-2I_r}{Gm}\right)$$

Therefore, we can see that the offset current $I_{offset}$ produced by the transconductor 200 is neutralized after one switch of the positive and negative inputting ends of the integrator 210 and will not affect the output of the integrator, and therefore upgrade the precision of the frequency-tuning loop. $V_{cp}$ and $V_{cn}$ then transform two differential signals to a single end signal through a differential to single converter, and then the output filtering by a low-pass filter is the Tuning Voltage.

Figure 2B:
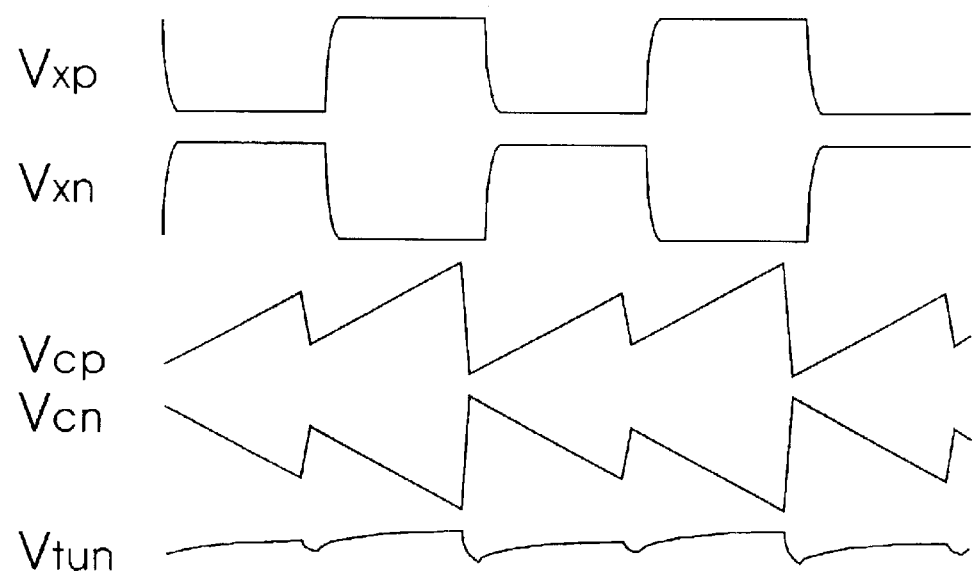
FIG. 2B shows the wave performance of each outputting end of the circuits showed in FIG. 2A.

However, in other preferred embodiments, $V_{cp}$ and $V_{cn}$ may be filtered by a low-pass filter first and then go through a differential to single converter, and in another preferred embodiment, if it comes to be that only the differential signal is needed, then $V_{cp}$ and $V_{cn}$ do not have to go through a differential to single converter but only through a low-pass filter. FIG. 2B shows the wave chart of clock $\Phi_{1a}$, $\Phi_{1b}$, $\Phi_2$, $\Phi_{3a}$, $\Phi_{3b}$ performed by each outputting end that showed in FIG. 2A.

Although specific embodiments have been illustrated and described, it will be obvious to those skilled in the art that various modifications may be made without departing from what is intended to be limited solely by the appended claims.

What is claimed is:

1. A frequency-tuning loop used in a Transconductor-Capacitor filter, comprising:

a transconductor;

a switch 1a and a switch 1b, one and of said switch 1a and said switch 1b connecting to a positive inputting end of said transconductor, and the other end of said switch 1a connecting to said positive current source to receive a input of said positive current, and the other end of said switch 1b connecting to a negative current source to receive a input of a negative current;

a switch 1a' and a switch 1b', one end of said switch 1a' and said switch 1b' connecting to a negative inputting end of said transconductor, and the other end of said switch 1a' connecting to said negative current source, and the other end of said switch 1b' connecting to said positive current source, wherein the on-and-off action of said switch 1a and said switch 1a' are simultaneously, the on-and-off action of said switch 1b and said switch 1b' are simultaneously but against said switch 1a and said switch 1a';

a first capacitance;

a second capacitance;

a switch 3a and a switch 3a', wherein the on-and-off action of said switch 3a and said switch 3a' is one cycle behind said on-and-off action of said switch 1a;

a switch 3b and a switch 3b', the on-and-off action of the said switch 3b and the said switch 3b' is one cycle behind said on-and-off action of said switch 1b;

a switch 2a, wherein one end of said switch 2a is connecting to a positive outputting end of said transconductor, and the other end of said switch 2a is connecting to said first capacitance, one end of said switch 3a and said switch 3b' at the same time, and the other end of said first capacitance being grounded;

a switch 2b, wherein one end of said switch 2b is connecting to a negative outputting end of said transconductor, and the other end of said switch 2b is connecting to said second capacitance, one end of said switch 3b and the said switch 3a' at the same time, and the other end of said second capacitance being grounded; and a integrated circuit, said integrated circuit comprising a integrator, a third capacitance, and a fourth capacitance, said third capacitance being used for storing the charges transmitted from said first capacitance, and said fourth being used for storing the charges transmitted from said second capacitance, and a positive inputting end of said integrator connecting to the other end of said switch 3a' and said switch 3b', a negative inputting end of said integrator connecting to the other end of said switch 3a and said switch 3b.

2. The frequency-tuning loop according to claim 1, further comprising a differential to single converter connecting to a outputting end of said integrator in order to transform a differential signal to single end signal.

3. The frequency tuning loop according to claim 2, further comprising a low-pass filter connecting to a outputting end of said differential to single converter.

4. The frequency-tuning loop according to claim 1, further comprising a low-pass filter connecting to a outputting end of said differential to single converter.

5. The frequency-tuning loop according to claim 1, further comprising a current source with same intensity and different direction connecting respectively to said positive and said negative inputting ends of said integrator.

6. The frequency-tuning loop according to claim 1, wherein said first capacitance and said second capacitance have the same capacitance value.

7. The frequency-tuning loop according to claim 1, wherein said third capacitance and said fourth capacitance have the same capacitance value.

* * * * *